(12) United States Patent
Su et al.

(10) Patent No.: US 11,881,436 B2
(45) Date of Patent: Jan. 23, 2024

(54) PRE AND POST PROCESSING METROLOGY APPARATUS

(71) Applicant: Applied Materials, Inc., Santa Clara, CA (US)

(72) Inventors: Jun-Liang Su, Singapore (SG); Chin Wei Tan, Singapore (SG); Fang Jie Lim, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 407 days.

(21) Appl. No.: 17/369,519

(22) Filed: Jul. 7, 2021

(65) Prior Publication Data

US 2023/0009864 A1 Jan. 12, 2023

(51) Int. Cl.
*H01L 21/66* (2006.01)
*G01B 9/02* (2022.01)

(52) U.S. Cl.
CPC .......... *H01L 22/20* (2013.01); *G01B 9/02049* (2013.01)

(58) Field of Classification Search
CPC ................ G01B 11/245; G01B 11/306; G01B 2210/56; G01B 9/02049; G01B 11/2441; G01N 21/9501; H01L 22/20
See application file for complete search history.

(56) References Cited

U.S. PATENT DOCUMENTS

| | | | |
|---|---|---|---|
| 6,188,478 B1 | 2/2001 | Fuchs et al. | |
| 6,690,473 B1* | 2/2004 | Stanke | B24B 37/34 356/369 |
| 7,585,686 B2 | 9/2009 | Verhaverbeke et al. | |
| 8,502,979 B2 | 8/2013 | Levy et al. | |
| 9,811,006 B2 | 11/2017 | Wildenberg et al. | |
| 10,962,886 B2 | 3/2021 | Van Der Laan et al. | |
| 2011/0270574 A1* | 11/2011 | Cruse | H01L 21/67276 702/176 |
| 2019/0072482 A1* | 3/2019 | Feng | G06N 20/00 |
| 2019/0164800 A1* | 5/2019 | Yin | H01L 21/68707 |
| 2022/0258304 A1* | 8/2022 | Lianto | G01N 21/211 |
| 2023/0238266 A1* | 7/2023 | Schulze | G01B 11/24 356/601 |
| 2023/0238287 A1* | 7/2023 | Lianto | G01N 13/00 438/14 |

* cited by examiner

*Primary Examiner* — Andre J Allen
(74) *Attorney, Agent, or Firm* — MOSER TABOADA

(57) ABSTRACT

Methods and apparatus for processing a substrate are provided. For example, metrology apparatus configured for use with a substrate processing platform comprise an interferometer configured to obtain a first set of measurements at a first set of points along a surface of a substrate, a sensor configured to obtain a second set of measurements at a second set of points different from the first set of points along the surface of the substrate, an actuator configured to position the interferometer and the sensor at various positions along a measurement plane parallel to the surface of the substrate for obtaining the first set of measurements and the second set of measurements, and a substrate support comprising a substrate support surface for supporting the substrate beneath the measurement plane while obtaining the first set of measurements and the second set of measurements.

18 Claims, 3 Drawing Sheets

PRE AND POST PROCESSING METROLOGY APPARATUS

FIELD

Embodiments of the present disclosure generally relate to metrology apparatus, and more particularly, to in-situ metrology apparatus for pre and post process substrate characteristic measurements.

BACKGROUND

Substrate (wafer) fabrication can include one or more processes. For example, substrate fabrication can include using one or more deposition processes (e.g., physical vapor deposition (PVD), chemical vapor deposition (CVP), atomic layer deposition (ALD), etc.), one or more etch processes (e.g., wet etch, dry etch, etc.), and one or more polishing processes (e.g., chemical mechanical polishing (CMP) or other suitable polishing processes).

Metrology plays an important role in substrate fabrication for research, unique technology development, and process controls. For example, as substrate (device) scales, reliance on metrology to ensure quality and yield in fabrication increases (e.g., especially important for research and development and for reduction in cost of fabrication and time-to-market for new products through better characterization of process tools and processes. Conventional methods for analyzing metrology and process data require transferring a processed substrate (wafer) from a processing chamber to a standalone apparatus. Such methods, however, are time consuming and can cause oxidation to develop on the substrate during transfer to the standalone apparatus.

SUMMARY

Methods and apparatus for processing a substrate are provided herein. In some embodiments, a metrology apparatus configured for use with a substrate processing platform includes an interferometer configured to obtain a first set of measurements at a first set of points along a surface of a substrate, a sensor configured to obtain a second set of measurements at a second set of points different from the first set of points along the surface of the substrate, an actuator configured to position the interferometer and the sensor at various positions along a measurement plane parallel to the surface of the substrate for obtaining the first set of measurements and the second set of measurements, and a substrate support comprising a substrate support surface for supporting the substrate beneath the measurement plane while obtaining the first set of measurements and the second set of measurements.

In accordance with at least some embodiments, a substrate processing platform includes a factory interface for receiving a substrate, a processing chamber connected to the factory interface for receiving the substrate for processing, a system controller for controlling processing of the substrate, and a metrology apparatus connected to one of the factory interface or the processing chamber for receiving the substrate and comprising an interferometer configured to obtain a first set of measurements at a first set of points along a surface of a substrate, a sensor configured to obtain a second set of measurements at a second set of points different from the first set of points along the surface of the substrate, an actuator configured to position the interferometer and the sensor at various positions along a measurement plane parallel to the surface of the substrate for obtaining the first set of measurements and the second set of measurements, and a substrate support comprising a substrate support surface for supporting the substrate beneath the measurement plane while obtaining the first set of measurements and the second set of measurements.

In accordance with at least some embodiments, a method of obtaining metrology data of one of a pre-processed or post-processed substrate includes moving an interferometer along a first axis for obtaining a first set of measurements at a first set of points along a surface of a substrate and moving a sensor along a second axis different from the first axis for obtaining a second set of measurements at a second set of points different from the first set of points along the surface of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
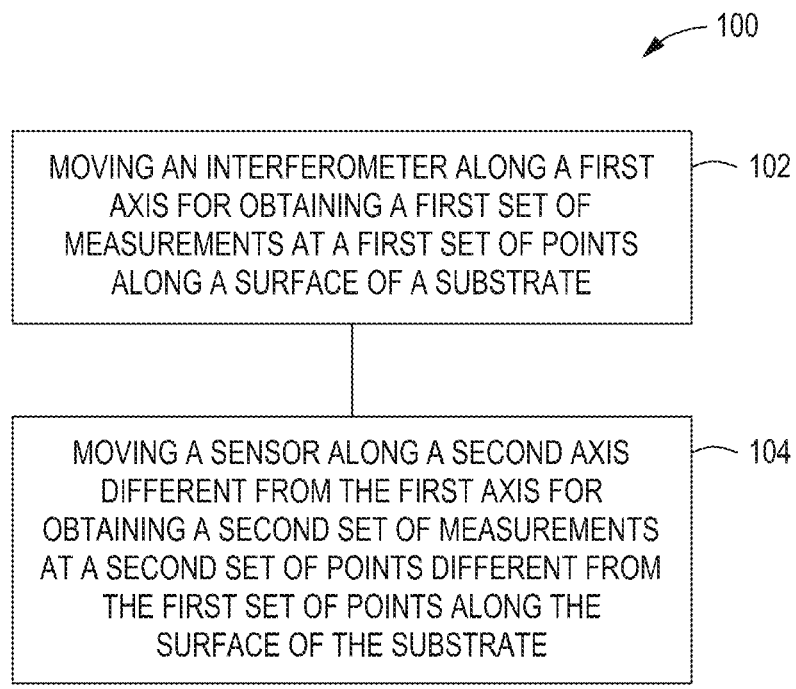
FIG. 1 is a method of obtaining metrology data of one of a pre-processed or post-processed substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for substrate processing and subsequent analyzation of metrology and process data within the same processing chamber are provided herein. For example, the apparatus can comprise an interferometer that is configured for measurement of points used to determine warpage, thickness, layers, and void detection, an IG sensor that is configured for measurement of highest points from sides of a pre-processed and/or a post-processed substrate, which can be used as quick go- and no-go applications. The apparatus can also comprise an x-linear actuator that is configured for multiple points measurements, e.g., carrier for IG during quick measurement, a y-linear actuator that is configured for multiple points measurements, e.g., line scan camera mounting, an adjustable pedestal that serves as a measurement surface, and a quick-change base that is configured for changing of metrology during down time and/or scheduled maintenance. The methods and apparatus described herein are capable of obtaining multiple parameter measurements, performing visual quality checks of processed substrate (e.g., to find defective substrates), and are capable of being integrated with existing processing chambers.

Figure 2:
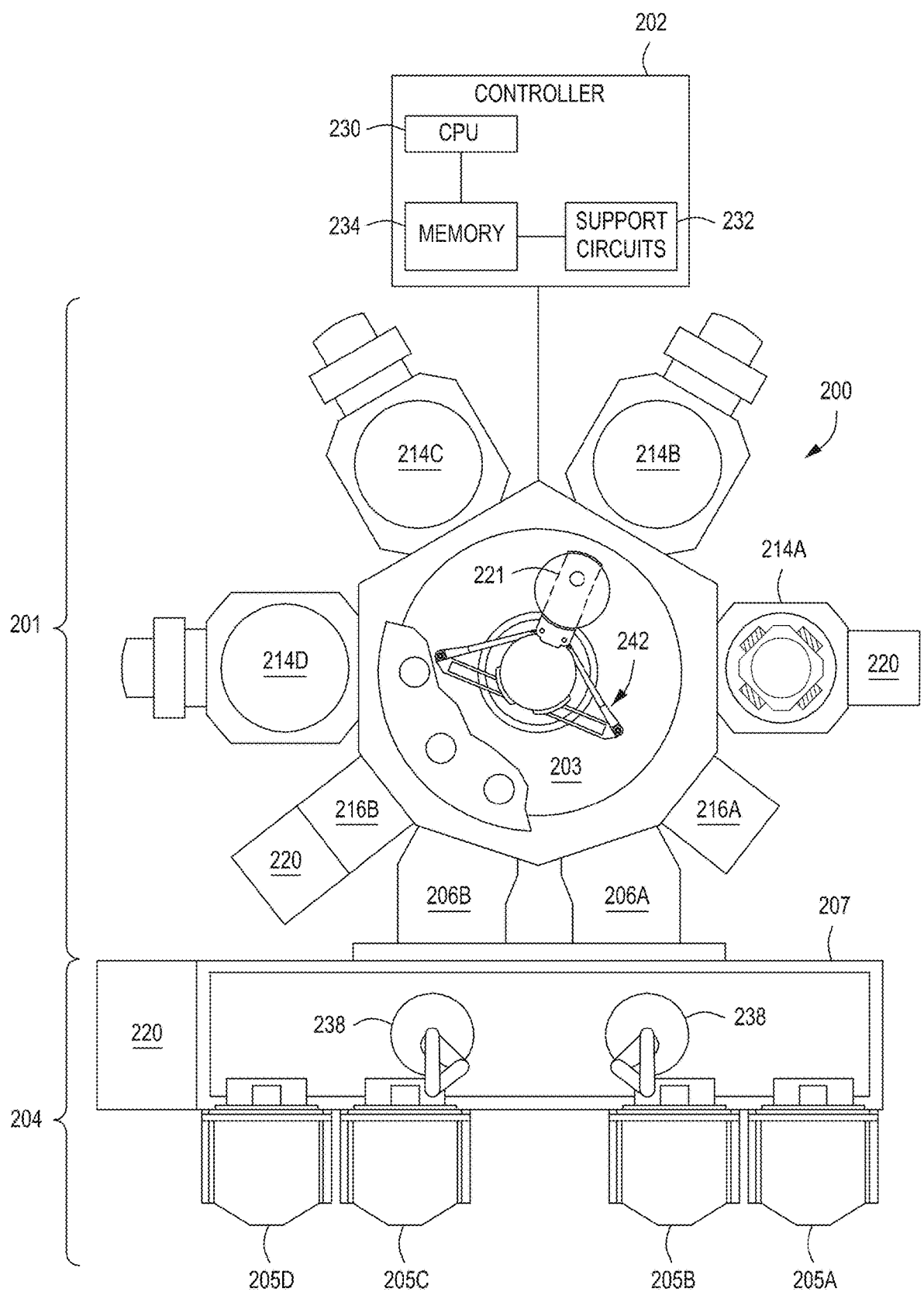
FIG. 2 is a diagram of an integrated tool comprising a metrology apparatus, in accordance with at least one embodiment of the present disclosure.

FIG. 1 is a method of obtaining metrology data of one of a pre-processed or post-processed substrate and FIG. 2 is a diagram of an integrated tool 200 comprising a metrology apparatus 220, in accordance with at least one embodiment of the present disclosure.

The method 100 may be performed in the tool 200 including any suitable processing chambers configured for one or more of physical vapor deposition (PVD), chemical vapor deposition (CVD) and/or atomic layer deposition (ALD), such as plasma enhanced ALD or thermal ALD (e.g., no plasma formation). Exemplary processing systems that may be used to perform the inventive methods disclosed herein may include the line of processing systems commercially available from Applied Materials, Inc., of Santa Clara, California Other processing chambers, including those from other manufacturers, may also be suitably used in connection with the teachings provided herein.

The tool 200 can be embodied in individual processing chambers that may be provided in a standalone configuration or as part of a cluster tool, for example, an integrated tool described below with respect to FIG. 2. Examples of the integrated tool include the line of integrated tools, available from Applied Materials, Inc., of Santa Clara, California. The methods described herein may be practiced using other cluster tools having suitable processing chambers coupled thereto, or in other suitable processing chambers. For example, in some embodiments, the inventive methods discussed above may be performed in an integrated tool such that there are limited or no vacuum breaks between processing steps. For example, reduced vacuum breaks may limit or prevent contamination (e.g., oxidation) on one or more portions of a substrate.

The integrated tool includes processing platform 201 (e.g., a vacuum-tight processing platform), a factory interface 204, and a system controller 202. The processing platform 201 comprises multiple processing chambers, such as processing chambers 214A, 214B, 214C, and 214D operatively coupled to a transfer chamber 203 (a vacuum substrate transfer chamber). The factory interface 204 is operatively coupled to the transfer chamber 203 by one or more load lock chambers (two load lock chambers, such as 206A and 206B shown in FIG. 2). The metrology apparatus 220 can be coupled to one or more of the processing chambers 214A, 214B, 214C, and 214D and/or one or more components (e.g., a docking station) of the factory interface 204, as will be described in greater detail below.

In some embodiments, the factory interface 204 comprises at least one docking station 207, a factory interface robot 238 to facilitate the transfer of one or more semiconductor substrates (wafers). The at least one docking station 207 is configured to accept one or more front opening unified pods (FOUPS). Four FOUPS, such as FOUPS 205A, 205B, 205C, and 205D are shown in the embodiment of FIG. 2. The factory interface robot 238 is configured to transfer the substrates from the factory interface 204 to the processing platform 201 through the load lock chambers, such as load lock chambers 206A and 206B. Additionally, in at least some embodiments, the factory interface robot 238 is configured to transfer the substrates from the at least one docking station 207 to the metrology apparatus 220, and vice versa.

Each of the load lock chambers 206A and 206B have a first port coupled to the factory interface 204 and a second port coupled to the transfer chamber 203. The load lock chamber 206A and 206B are coupled to a pressure control system (not shown) which pumps down and vents the load lock chambers 206A and 206B to facilitate passing the substrates between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring the substrates 221 between the load lock chamber 206A and 206B and the processing chambers 214A, 214B, 214C, and 214D. Additionally, the vacuum robot 242 is capable of the transferring the substrates 221 to a metrology apparatus connected to the processing chambers 214A, 214B, 214C, and 214D. For illustrative purposes, the metrology apparatus 220 is shown connected to the processing chamber 214A.

In some embodiments, the processing chambers 214A, 214B, 214C, and 214D comprise at least an ALD chamber, a CVD chamber, a PVD chamber, an e-beam deposition chamber, and/or an electroplating, electroless (EEP) deposition chamber.

In some embodiments, one or more optional service chambers (shown as service chambers 216A and 216B) may be coupled to the transfer chamber 203. The service chambers 216A and 216B may be configured to perform other substrate processes, such as degassing, bonding, chemical mechanical polishing (CMP), wafer cleaving, etching, plasma dicing, orientation, substrate metrology, cool down and the like. In at least some embodiments, the metrology apparatus 220 can be coupled to one or both of the service chambers 216A and 216B. For illustrative purposes, the metrology apparatus 220 is shown connected to the service chamber 216B.

The system controller 202 controls the operation of the tool 200 using a direct control of the processing chambers 214A, 214B, 214C, and 214D or, alternatively, by controlling the computers (or controllers) associated with the processing chambers 214A, 214B, 214C, and 214D and the tool 200. In operation, the system controller 202 enables data collection and feedback from the respective chambers and systems to optimize performance of the tool 200. For example, in at least some embodiments, the system controller 202 collects/feedback information from the metrology apparatus 220 (e.g., pre-processed or post-processed substrate). The system controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage medium) and, when executed by the central processing unit 230, transform the central processing unit 230 into a specific purpose computer. The software routines may also be stored and/or executed by a second controller (not shown) that is located remotely from the tool 200.

Figure 3:
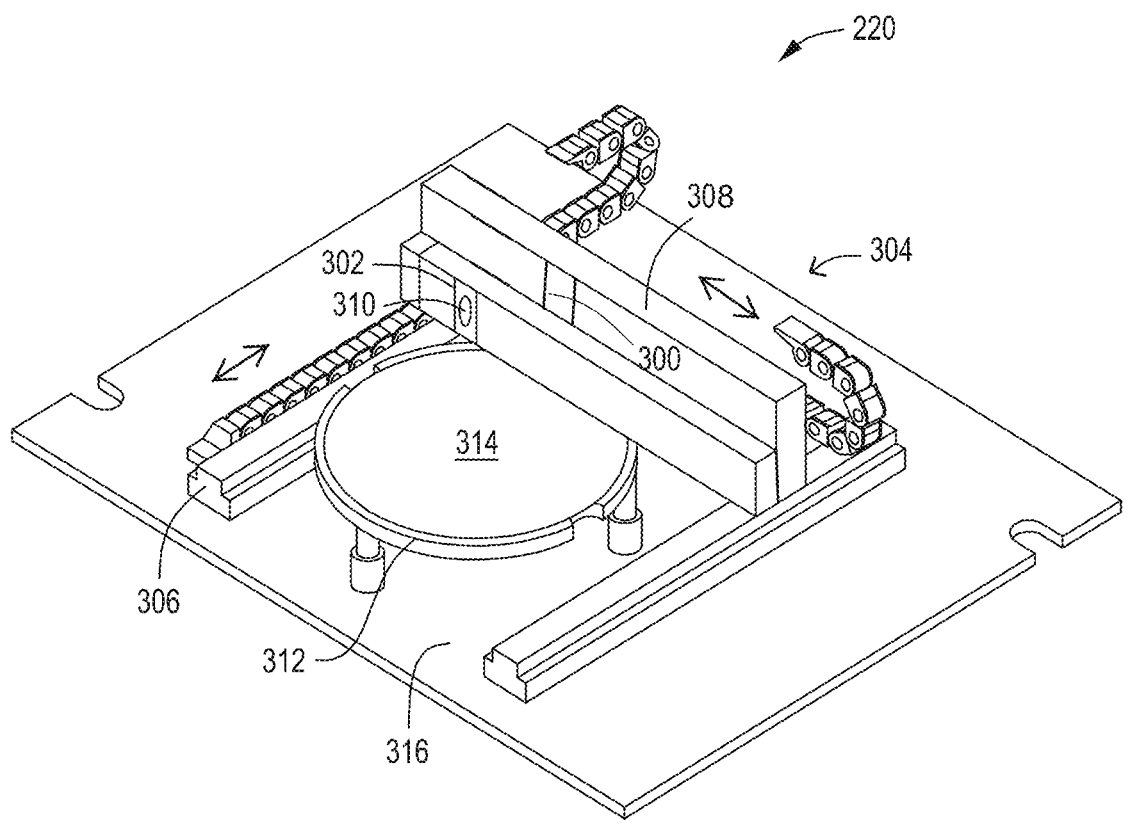
FIG. 3 is a diagram of a metrology apparatus configured for use with the method of FIG. 1 and the integrated tool of FIG. 2, in accordance with at least one embodiment of the present disclosure.

FIG. 3 is a diagram of a metrology apparatus (e.g., the metrology apparatus 220) configured for use with the method 100 of FIG. 1 and the integrated tool 200 (e.g., a substrate processing platform) of FIG. 2, in accordance with at least one embodiment of the present disclosure. For illustrative purposes, only the main components of the metrology apparatus 220 are shown.

For example, the metrology apparatus 220 comprises an interferometer 300 which is configured to obtain a first set of measurements at a first set of points along a surface of a substrate (e.g., the substrate 221). For example, the interferometer 300 can be any suitable interferometer that is capable of determining at least one of warpage, thickness, layers, and void detection of a substrate (e.g., by merging two or more sources of light, radio, or sound to create an interference pattern, which can be measured and analyzed).

A sensor 302 is configured to obtain a second set of measurements at a second set of points different from the first set of points along the surface of the substrate. For example, the sensor 302 can be any suitable sensor that is capable of determining high points along sides of the substrate. In at least some embodiments, the sensor 302 can be a charge-coupled device laser.

An actuator 304 is configured to position the interferometer 300 and the sensor 302 at various positions along a measurement plane parallel to the surface of the substrate for obtaining the first set of measurements and the second set of measurements. For example, the actuator 304 comprises an x-linear actuator 306 that carries the interferometer 300 and the sensor 302 along an x-axis and a y-linear actuator 308 that carries the interferometer 300 and the sensor 302 along a y-axis. The x-linear actuator 306 and the y-linear actuator 308 can be configured to move (e.g., under the control of the system controller 202) along the x-axis and the y-axis using one or more links, gears, belts, motors, etc. For example, in at least some embodiments, one or more rail, link, and/or motor configurations can move the x-linear actuator 306 and the y-linear actuator 308 along the respective x-axis and the y-axis. In at least some embodiments a rail, a link and a motor configuration can be used on each of the x-linear actuator 306 and the y-linear actuator 308 to move the interferometer 300 and the sensor 302 along the x-axis and the y-axis. In at least some embodiments, the x-linear actuator 306 and the y-linear actuator 308 are independently movable with respect to each other. In at least some embodiments, a camera 310 can be coupled to the y-linear actuator 308. For example, the camera can be a component of the sensor 302. In at least some embodiments, the data/information obtained from the interferometer 300, the sensor 302, and/or the camera 310 can transmitted to the system controller 202 via wired and/or a wireless configurations.

A substrate support 312 (e.g., a pedestal) can comprise a substrate support surface 314 for supporting the substrate beneath the measurement plane while obtaining the first set of measurements and the second set of measurements. In at least some embodiments, the substrate support 312 can be adjustable (e.g., under the control of the system controller 202) for receiving the substrate and while obtaining the first set of measurement points and the second set of measurement points.

A base 316 is configured to support the interferometer 300, the sensor 302, the actuator 304, and the substrate support 312 such that the metrology apparatus 220 can be integrated into a substrate processing platform (e.g., the base 316 can be removably coupled to one or more of the components of the substrate processing platform). Having a base 316 that can be integrated with the one or more of the components of the substrate processing platform can allow for relatively quick swapping of metrology information during down time (e.g., scheduled maintenance).

With reference again to FIG. 1, initially one or more substrates, semiconductor wafers, thermal modular assemblies, or the like may be loaded into one or more of the four FOUPS, such as the FOUPS 205A, 205B, 205C, and 205D (FIG. 3A). For example, in at least some embodiments, a substrate (the substrate 221) can be loaded into the FOUP 205A.

In at least some embodiments, a pre-process measurement can first be obtained, e.g., for detecting warpage, thickness, layers, void detection, and/or determining high points along sides of the substrate. For example, the metrology apparatus 220 can be coupled to the at least one docking station 207 of the factory interface 204. Alternatively or additionally, the metrology apparatus 220 can be coupled to one or more of the processing chambers 214A, 214B, 214C, and 214D (e.g., the processing chamber 214A) of processing platform 201 and/or at the service chambers 216A and 216B (e.g., the service chamber 216B). In at least some embodiments, the metrology apparatus 220 that is coupled to the at least one docking station 207 performs 102, which comprises moving an interferometer along a first axis for obtaining a first set of measurements at a first set of points along a surface of a substrate. For example, under the control of the system controller 202, the x-linear actuator 306 can be moved along the x-axis to detect warpage, thickness, layers, void detection. Next, the data collected from the interferometer 300 can be transmitted to the system controller 202.

Next, at 104, the method 100 comprises moving a sensor along a second axis different from the first axis for obtaining a second set of measurements at a second set of points different from the first set of points along the surface of the substrate. For example, under the control of the system controller 202, the y-linear actuator 308 can be moved along the y-axis to determine high points along sides of the substrate. Next, the data collected from the sensor 302 can be transmitted to the system controller 202. In at least some embodiments, the camera 310 can be used to obtain side profile measurements, which can also be transmitted to the system controller 202.

Next, the factory interface robot 238 can transfer the substrate from the at least one docking station 207 of the factory interface 204 to the processing platform 201 through, for example, the load lock chamber 206A. The vacuum robot 242 can transfer the substrate from the load lock chamber 206A to and from one or more of the processing chambers 214A, 214B, 214C, and 214D and/or the service chambers 216A and 216B to process the substrate for further processing. For example, in at least some embodiments, the vacuum robot 242 can transfer the substrate to the processing chamber 214A where one or more substrate processes (e.g., BEOL substrate packaging) can be performed. For example, in at least some embodiments, PVD can be performed on the substrate for forming a barrier/seed layer on the substrate.

Next, a post-process measurement can be obtained, e.g., for detecting warpage, thickness, layers, void detection, and/or determining high points along sides of the substrate. The post-process measurement can be obtained at the metrology apparatus 220 coupled to one or more of the processing chambers 214A, 214B, 214C, and 214D, at the service chambers 216A and 216B, and/or at the at least one docking station 207, e.g., using 102 and 104 described above. In at least some embodiments, the post-process measurement is performed at the metrology device coupled to the processing chamber 214A.

Next, the system controller can perform a post-process analysis. For example, the system controller 202 can compare the pre-post measurements with the post-process measurements. In at least some embodiments, the system controller 202 can use a comparison of the pre-post measurements with the post-process measurements to create an optimized recipe for future substrate processes. For example, after a comparison of the pre-post measurements with the post-process measurements, if the system controller 202 determines that warpage is present on the substrate, a thickness of the barrier/seed layer on the substrate is not within an acceptable range, a void is present on the substrate, and/or high points are along sides of the substrate, the system controller 202 can adjust one or more of the process parameters associated with the recipe to correct such issues. For example, if the system controller 202 determines that warpage is present on the substrate, the system controller 202 can change a recipe to decrease a temperature and increase gas flow during processing.

While the foregoing is directed to embodiments of the present disclosure, other and further embodiments of the disclosure may be devised without departing from the basic scope thereof.

The invention claimed is:

1. A metrology apparatus configured for use with a substrate processing platform, comprising:
   an interferometer configured to obtain a first set of measurements at a first set of points along a surface of a substrate;
   a sensor configured to obtain a second set of measurements at a second set of points different from the first set of points along the surface of the substrate;
   an actuator configured to position the interferometer and the sensor at various positions along a measurement plane parallel to the surface of the substrate for obtaining the first set of measurements and the second set of measurements, wherein the actuator comprises an x-linear actuator that carries the interferometer and the sensor along an x-axis and a y-linear actuator that carries the interferometer and the sensor along a y-axis; and
   a substrate support comprising a substrate support surface for supporting the substrate beneath the measurement plane while obtaining the first set of measurements and the second set of measurements.

2. The metrology apparatus of claim 1, wherein the sensor is a charge-coupled device laser.

3. The metrology apparatus of claim 1, wherein the substrate support is adjustable for receiving the substrate and during obtaining the first set of measurements and the second set of measurements.

4. The metrology apparatus of claim 1, wherein the first set of measurements at the first set of points determine at least one of warpage, thickness, layers, and void detection of the substrate.

5. The metrology apparatus of claim 1, wherein the second set of measurements at the second set of points different from the first set of measurements at the first set of points determine high points along sides of the substrate.

6. The metrology apparatus of claim 1, further comprising a camera coupled to the y-linear actuator.

7. The metrology apparatus of claim 1, wherein the x-linear actuator and the y-linear actuator are independently movable with respect to each other.

8. The metrology apparatus of claim 1, further comprising a base that is configured to support the interferometer, the sensor, the actuator, and the substrate support such that the metrology apparatus can be is integrated into the substrate processing platform.

9. A substrate processing platform, comprising:
   a factory interface for receiving a substrate;
   a processing chamber connected to the factory interface for receiving the substrate for processing;
   a system controller for controlling processing of the substrate; and
   a metrology apparatus connected to one of the factory interface or the processing chamber for receiving the substrate and comprising:
   an interferometer configured to obtain a first set of measurements at a first set of points along a surface of the substrate;
   a sensor configured to obtain a second set of measurements at a second set of points different from the first set of points along the surface of the substrate;
   an actuator configured to position the interferometer and the sensor at various positions along a measurement plane parallel to the surface of the substrate for obtaining the first set of measurements and the second set of measurements, wherein the actuator comprises an x-linear actuator that carries the interferometer and the sensor along an x-axis and a y-linear actuator that carries the interferometer and the sensor along a y-axis; and
   a substrate support comprising a substrate support surface for supporting the substrate beneath the measurement plane while obtaining the first set of measurements and the second set of measurements.

10. The substrate processing platform of claim 9, wherein the sensor is a charge-coupled device laser.

11. The substrate processing platform of claim 9, wherein the substrate support is adjustable for receiving the substrate and during obtaining the first set of measurements and the second set of measurements.

12. The substrate processing platform of claim 9, wherein the first set of measurements at the first set of points determine at least one of warpage, thickness, layers, and void detection of the substrate.

13. The substrate processing platform of claim 9, wherein the second set of measurements at the second set of points different from the first set of measurements at the first set of points determine high points along sides of the substrate.

14. The substrate processing platform of claim 9, further comprising a camera coupled to the y-linear actuator.

15. The substrate processing platform of claim 9, wherein the x-linear actuator and the y-linear actuator are independently movable with respect to each other.

16. The substrate processing platform of claim 9, further comprising a base that is configured to support the interferometer, the sensor, the actuator, and the substrate support such that the metrology apparatus is integrated into the substrate processing platform.

17. A method of obtaining metrology data of one of a pre-processed or post-processed substrate, comprising:
   moving an interferometer, via an actuator comprising an x-linear actuator, along an x-axis for obtaining a first set of measurements at a first set of points along a surface of a substrate; and
   moving a sensor via the actuator comprising an y-linear actuator, along a y-axis different from the x-axis for obtaining a second set of measurements at a second set of points different from the first set of points along the surface of the substrate.

18. The method of claim 17, wherein the first set of measurements at the first set of points determine at least one of warpage, thickness, layers, and void detection of the substrate, and wherein the second set of measurements at the second set of points different from the first set of points determine high points along sides of the substrate.

* * * * *